United States Patent [19]

MacElwee et al.

[11] Patent Number: 4,651,408

[45] Date of Patent: Mar. 24, 1987

[54] FABRICATION OF STACKED MOS DEVICES UTILIZING LATERAL SEEDING AND A PLURALITY OF SEPARATE IMPLANTS AT DIFFERENT ENERGIES

[75] Inventors: Thomas W. MacElwee, Ottawa; Iain D. Calder, Nepean; James J. White, Ashton, all of Canada

[73] Assignee: Northern Telecom Limited, Montreal, Canada

[21] Appl. No.: 611,549

[22] Filed: May 17, 1984

[30] Foreign Application Priority Data

Jan. 5, 1984 [CA]  Canada .................................... 444777

[51] Int. Cl.$^4$ .................... H01L 21/324; H01L 21/36
[52] U.S. Cl. .................................... 29/576 J; 29/571;
29/576 B; 29/576 E; 29/576 T; 29/578; 29/580;
148/1.5; 148/175; 148/DIG. 91; 148/DIG.
164; 156/612; 357/23.7; 357/23.9; 357/42;
357/59
[58] Field of Search .................. 29/571, 576 J, 576 B,
29/576 E, 576 T, 578, 580; 148/1.5, 175, DIG.
164, DIG. 91; 156/612; 357/23.7, 23.9, 41, 42,
44, 59

[56] References Cited

U.S. PATENT DOCUMENTS

| 4,467,518 | 8/1984 | Bansal et al. | 29/571 |
| 4,476,475 | 10/1984 | Naem et al. | 357/44 X |
| 4,487,635 | 12/1984 | Kugimiya et al. | 148/1.5 |
| 4,488,348 | 12/1984 | Jolly | 29/571 |
| 4,500,905 | 2/1985 | Shibata | 357/41 X |
| 4,523,370 | 6/1985 | Sullivan et al. | 29/576 B |
| 4,555,843 | 12/1985 | Malhi | 29/571 |

OTHER PUBLICATIONS

Douglas, J. H., "The Route to 3-D Chips" High Technology, Sep. 1983, pp. 55-59.

*Primary Examiner*—William G. Saba
*Attorney, Agent, or Firm*—Schwartz, Jeffery, Schaab, Mack, Blumenthal & Evans

[57] ABSTRACT

In a process for manufacturing vertically integrated MOS devices and circuits, gate oxide and a gate are formed on a semiconductor substrate such as a silicon substrate. A layer of polysilicon is then deposited over the wafer, the polysilicon contacting the substrate silicon through a window in the gate oxide. The substrate silicon and the polysilicon are then laser melted and cooled under conditions that encourage crystal seeding from the substrate into the polysilicon over the gate. Subsequently, ions are implanted into the silicon substrate and the polysilicon to form source and drain regions. By introducing the source and drain dopants after melt associated seeding of the polysilicon, the risk of dopant diffusion into the device channel regions is avoided.

12 Claims, 21 Drawing Figures

FABRICATION OF STACKED MOS DEVICES UTILIZING LATERAL SEEDING AND A PLURALITY OF SEPARATE IMPLANTS AT DIFFERENT ENERGIES

This invention relates to a process for making stacked or vertically integrated metal-oxide-semiconductor (MOS) devices.

The complementary metal-oxide-semiconductor (CMOS) inverter is the building block for all CMOS digital circuits and systems. The inverter consists of an n-channel enhancement mode transistor and a p-channel enhancement mode transistor connected in series. The main advantage of CMOS circuits over for example, NMOS circuits is their extremely low power consumption. However they tend to be slower than NMOS circuits because relatively low mobility holes are used as majority carriers in the p-channel devices and because there is a large parasitic capacitance inherent in the fabrication of conventional CMOS circuits. A further disadvantage of CMOS circuits is the large surface area required to fabricate a single inverter. Thus even though the n- and p-channel transistors may be of the same size or channel length, the complementary transistor occupies a much larger surface area because of the opposite conductivity type tub that must be created in which to build the complementary device. As a result the packing density for conventional CMOS circuits is limited because enough space must be left for encroachment of the various two depletion layers during operation without the occurrence of punch-through. The need for an oppositely compensated tub for the complementary transistor also results in a fabrication process that requires typically eleven photoengraving steps for a complete device. Finally, under certain conditions parasitic bipolar transistor action can be set up between the two devices by the PNPN structure so, thereby rendering them useless.

It has been suggested that the n-type tub be eliminated to improve the packing density of CMOS circuits. This procedure, however, requires that islands of n- and p-type material be available in which to build the transistors. In silicon-on-sapphire (SOS) technology a thin film of silicon is grown on a sapphire substrate, patterned into individual transistor islands and then doped as required. Although this has provided a large improvement over conventional CMOS circuits, packing density is not materially improved since the process still relies on the devices being placed side-by-side. Also the mobility of both electrons and holes are lower in the grown films than in a single crystal silicon substrate.

Device physics and process technology have imposed a number of constraints on increasing VLSI circuit packing density by scaling down device dimensions. It is known that packing density can be increased by stacking thin film devices on top of one another. This technique has, for example, already been successfully implemented in the manufacture of CMOS inverters.

Stacked MOS devices are disclosed in several publications. Gibbons et al, IEEE Electronic Device Letters, EDL-1, page 1 et seq., 1980, describes a CMOS inverter having a common gate for both the n-channel and the p-channel transistor. This stacked inverter has a p-channel transistor in the bulk silicon and a laser recrystallized polysilicon thin film n-channel transistor overlying the bulk semiconductor, a common gate and gate oxide layers. A similar stacked CMOS inverter has also been proposed by Goeloe et al, IEDM, Washington, D.C., page 55 et seq., 1981. Both of these inverters suffer from low n-channel mobility and high parasitic capacitance since source and drain of the top n-channel transistor are built on top of the common gate. A further CMOS inverter is known from Colinge et al, IEEE Electronic Device Letters, EDL-2, page 250 et seq., 1981. In the Colinge inverter the top and bottom devices share a common drain contact, the top polysilicon film being in contact with the underlying bulk silicon in the drain region. Essentially, in known stacked or vertically integrated devices, the upper channel polysilicon is recrystallized into large grains with several grain boundaries which inhibit electrical current flow. Consequently compared with the underlying bulk silicon, the recrystallized polysilicon has a lower carrier mobility and poorer reproducibility from device to device since the number of grain boundaries varies randomly.

It has been recognized, for example, by Lam et al, IEEE Transactions on Electron Devices, Vol. ED-29, pages 389 to 394, March 1982, that the crystalline structure of material prepared from polysilicon can be made more nearly single crystal by seeding epitaxial growth within the polysilicon from the adjacent bulk silicon where the polysilicon contacts the bulk silicon. However, when lateral seeding is applied to the manufacture of MOS devices, any melting of the substrate in the contact area can cause rapid diffusion of dopants from the drain in the case of an inverter, and from both source and drain in the case of a stacked MOS transistor as described in copending patent application STACKED, MOS TRANSISTOR, Ser. No. 442,864, filed Nov. 19, 1982 now U.S. Pat. No. 4,476,475. The dopant diffuses through the molten silicon and reaches the upper channel region to destroy its functionality by rendering it highly conducting. A processing technique is now proposed in which lateral seeding is achieved without such damaging dopant diffusion.

According to the invention, there is provided a process for the fabrication of vertically integrated MOS devices comprising the ordered steps of:

forming field oxide regions to isolate devices on a semiconductor substrate;

forming a first gate oxide region on the substrate;

forming a gate on the first oxide region;

forming a second gate oxide region over the gate;

depositing a polycrystalline semiconductor layer over the gate and oxide regions so as to directly contact the substrate at at least one position;

heating, melting and then cooling the polycrystalline semiconductor to promote lateral seeding thereof from the substrate semiconductor at the or each contact position; and implanting ions to form source and drain locations in both the substrate and recrystallized polycrystalline semiconductor.

Preferably the semiconductor is silicon.

The implantation step can be performed as a plurality of separate implants in order to achieve desired concentration of ions at desired depths within the recrystallized and bulk semiconductor.

Following ion implantation of source and drain regions, implantation damage can be repaired by laser annealing.

The method can further include coating the vertically integrated device with a protective coating, opening windows in the coating and depositing metal contacts through the windows to contact source and drain regions of the device.

The device can be configured as an inverter by making channel regions in the substrate and recrystallized silicon of opposite conductivity type and by making a single contact position at which drain regions are subsequently formed, the drain region in the recrystallized silicon being a single crystal continuation of the drain region in the substrate.

Alternatively, the device can be configured as a stacked MOS transistor in which the transistor channel is split into two parts of the same conductivity type, one part in the recrystallized silicon and one part in the substrate silicon, the device having a first common source contact position and a second common drain contact position.

The device gate can be made by depositing a layer of polysilicon, and doping, laser annealing and etching the layer.

According to another aspect of the invention there is provided a vertically integrated MOS device in which upper channel, source and drain regions are formed in a recrystallized polysilicon layer and lower channel source and drain regions are formed in a silicon substrate wherein at at least one location, the recrystallized polysilicon layer forms a seeded single crystal continuation of the substrate silicon.

Particularly for an inverter, the single crystal continuation can be present at a junction zone between the upper and lower drain regions. Particularly for a transistor, a single crystal continuation can be present at junction zones between both the upper and lower drain regions and the upper and lower source regions.

An embodiment of the invention will now be described by way of example, with reference to the accompanying drawings, in which.

Figure 1:
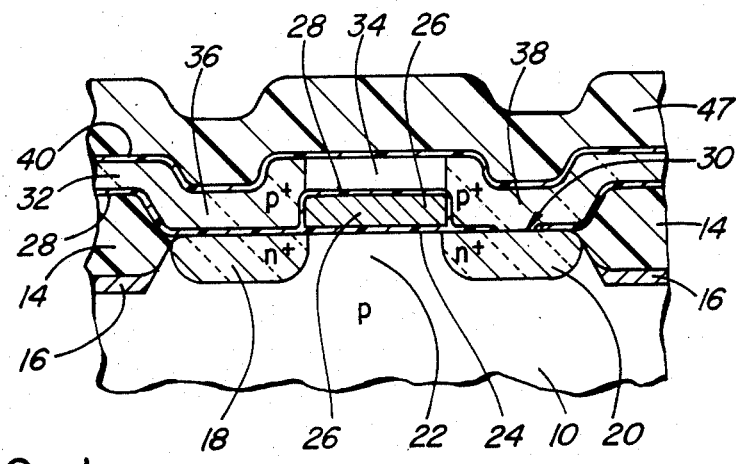
FIG. 1 is a sectional view showing a stacked CMOS inverter made using a process according to the invention.

Referring to FIG. 1, the stacked complementary metal-oxide-semiconductor (CMOS) inverter has a p-type silicon substrate 10. A device well extends between field oxide regions 14 which are underlain by relatively conducting regions 16. Within the substrate are n+-type source and drain regions 18 and 20 which extend between a channel region 22. Overlying the substrate within the device well is a first gate oxide layer 24, a recrystallized polysilicon gate 26 and a second gate oxide layer 28 which extends over the field oxide 14 and device well and is interrupted only at a location 30. Overlying the gate oxide 28 is a recrystallized polysilicon layer 32 which has an n-type channel region 34 overlying the gate 26 and p+-type source and drain regions 36 and 38. Overlying the top channel is an antidiffusion oxide layer 40 which is itself overlain by a layer of phosphorous silica glass 47.

Figure 3:
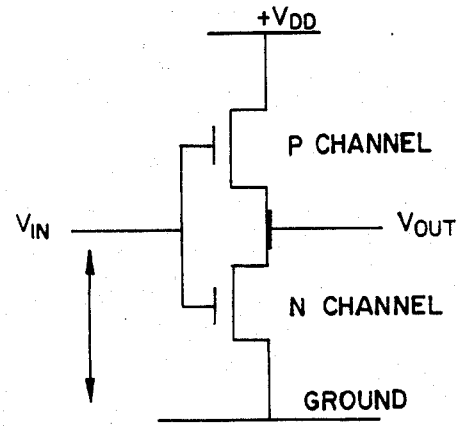
FIG. 3 is a circuit schematic diagram of the FIG. 1 inverter.
Figure 4:
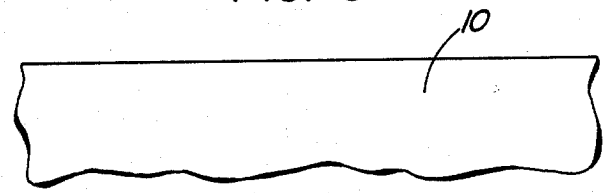
FIGS. 4 to 20 show successive stages in the fabrication of the FIG. 1 inverter using the process.
Figure 2:
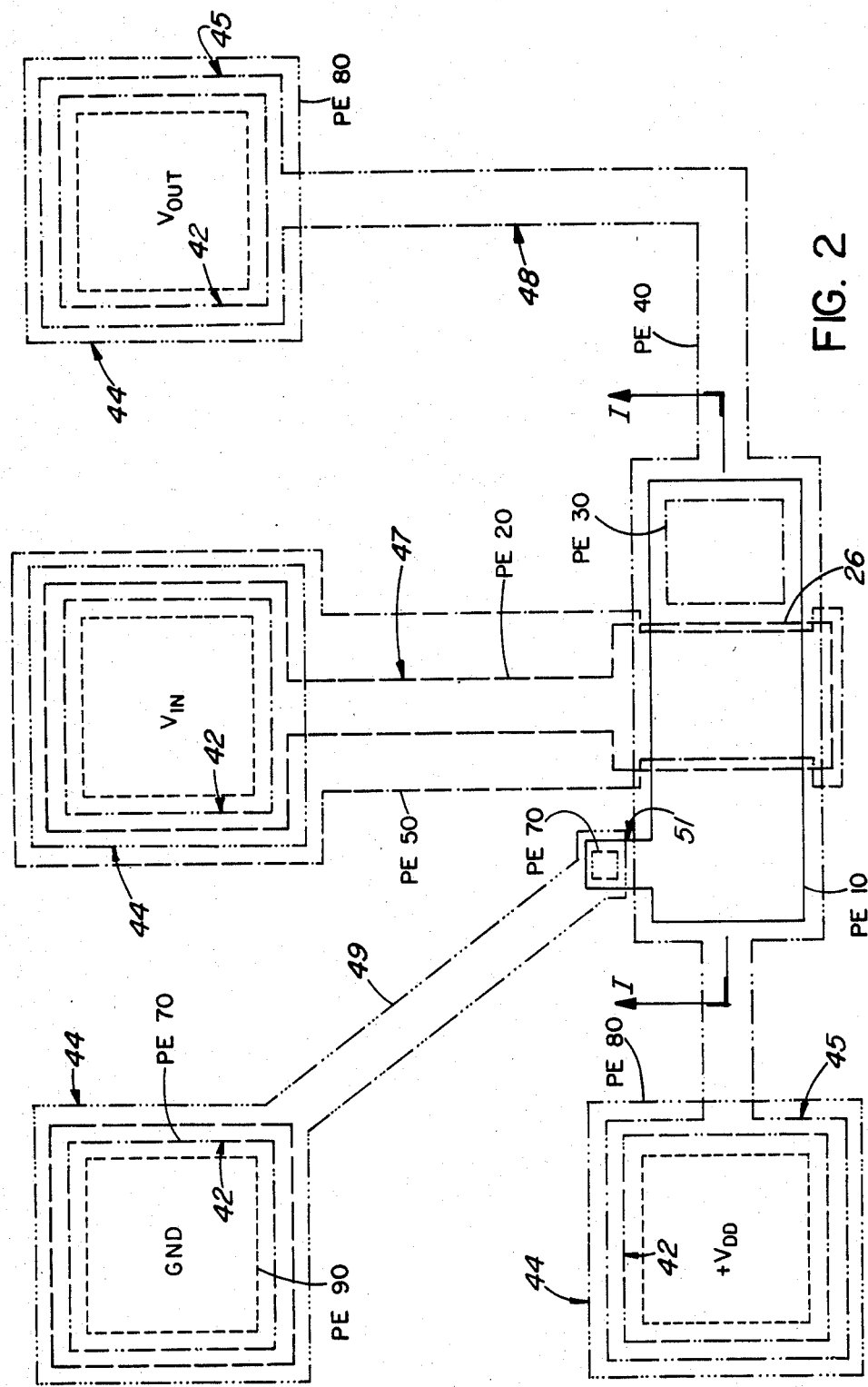
FIG. 2 is a schematic plan view of superimposed masks used in fabricating the FIG. 1 inverter using the process, the mask plan corresponding to a plan view of the inverter.

As shown in the mask plan of FIG. 2 part of which corresponds to the sectional view of FIG. 1, the device has four bonding pad locations marked by aluminum contacts 44. Contacts at $V_{DD}$ and $V_{OUT}$ extend through layer 42 (mask PE 70) of phosphorus silica glass (PSG) to contact parts 45 of the layer 32 (mask PE 40). Contact $V_{IN}$ overlies an extension 47 of the gate 26 (mask PE 20). Contact GND is integral with an interconnect 49 which extends through a window in the PSG overlying an extension 51 of the device well (mask PE 10). The complete device is covered by a layer of Pyrox (registered trademark) which has windows through which connection to the aluminum contacts 44 can be made. A schematic circuit diagram of the FIGS. 1 and 2 inverter is shown in FIG. 3.

Referring specifically to the processing drawings of FIGS. 4 to 19, FIG. 4 shows a p-type <100> 6–10 ohm centimeter silicon substrate 10.

Figure 5:
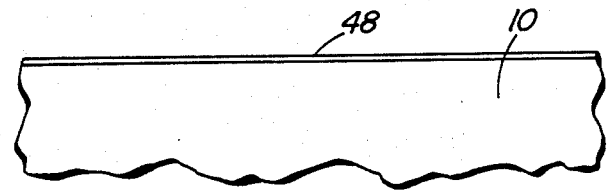

As shown in FIG. 5 a 400Å oxide layer 48 is first thermally grown and then the substrate resistivity is made suitable for CMOS devices by implanting boron ions with ion energy 120 KeV and a dose of $2.5 \times 10^{11}$ ions/cm$^2$.

Figure 6:
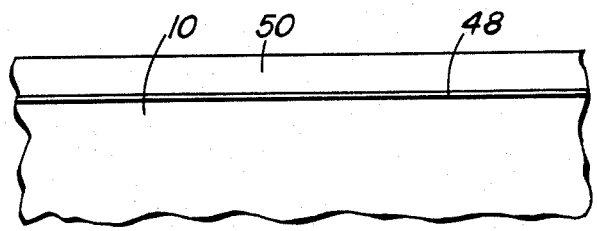
Figure 7:
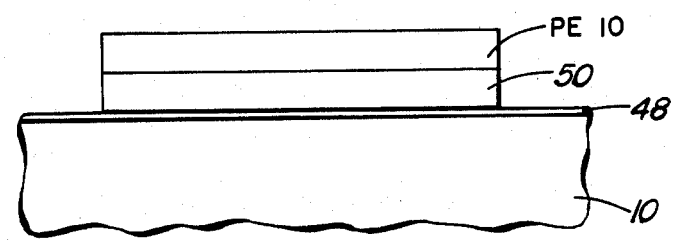
Figure 8:
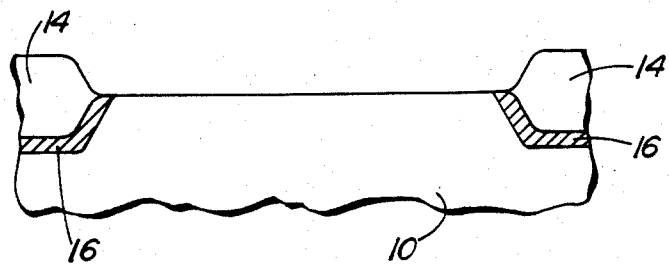

Referring to FIGS. 6 and 7, a 1200Å thick layer 50 of silicon nitride ($Si_3N_4$) and a resist layer are deposited and photoengraved using a mask PE 10 (FIG. 2). The substrate is then subjected to a further boron ion implantation step using ions of energy 50keV and a dose of $3 \times 10^{13}$ ions/cm$^2$ and then a 0.5 micron layer of field oxide is thermally grown as shown in FIG. 8. This produces p-type conducting regions 16 underlying field oxide regions 14 to isolate the eventual n-type devices and ensure that parasitic capacitance and transistor action do not occur outside the device well.

Figure 9:
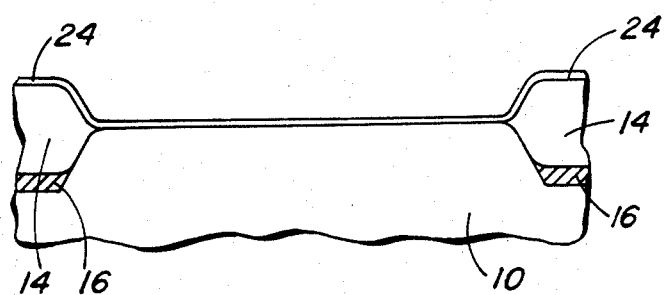
Figure 10:
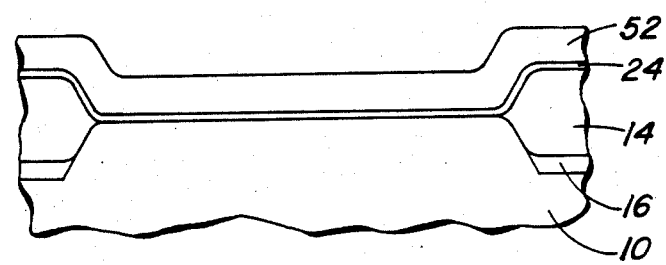

Referring to FIG. 9, following removal of the nitride 50, a first gate oxide layer 24 of 500Å is grown over the wafer and this is followed by a low pressure chemically vapour deposited layer 52 of polycrystalline silicon or polysilicon. This gate polysilicon layer 52 is rendered highly conducting firstly by subjecting the polysilicon to a $POCl_3$ atmosphere for 30 minutes at 900° C. and then laser recrystallizing the layer using a 50 micron diameter argon laser beam with an output power of 7.5 watts and a scanning rate of 50 cm/second. During this step the n-type phosphorus dopant is distributed throughout the polysilicon and the top surface of the polysilicon is prepared for further oxide growth (FIG. 10).

Figure 11:
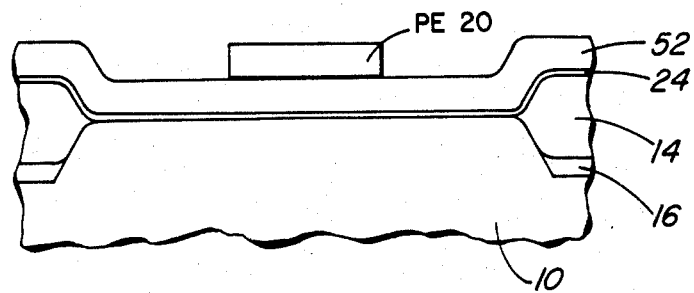
Figure 12:
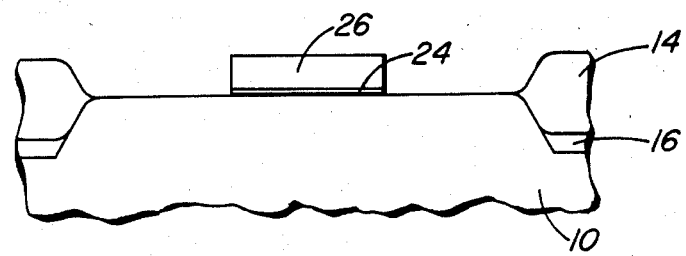
Figure 13:
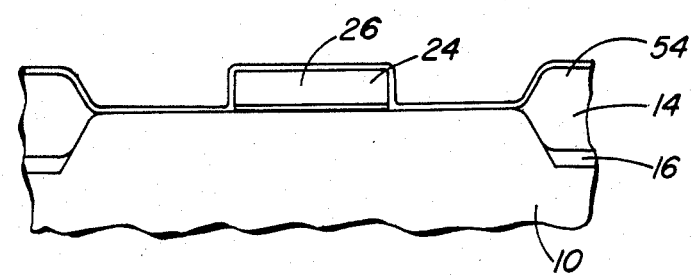

Referring to FIG. 11, a second mask, PE 20 (FIG. 2) is formed and the wafer is etched (FIG. 12) to remove the recrystallized polysilicon 52 and underlying oxide except at a gate region 26.

Figure 14:
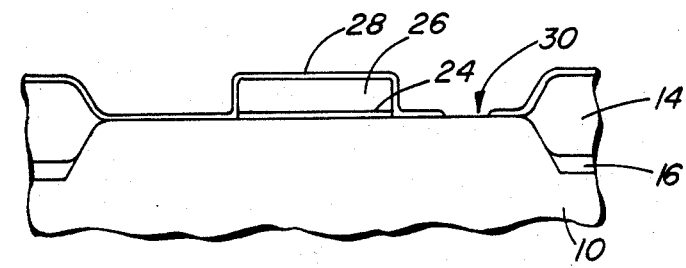

A second gate oxide layer 54 of 500Å is then thermally grown over the wafer (FIG. 13) and using a third mask PE 30 (FIG. 2) a contact window 30 is made to the substrate 10 (FIG. 14).

Figure 15:
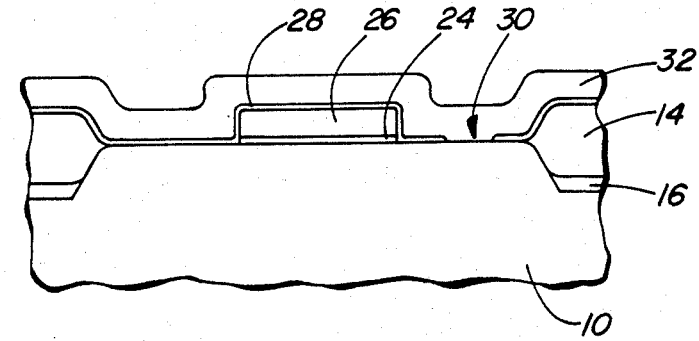

Referring to FIG. 15 a second polysilicon layer is low pressure chemically vapour deposited to a depth of 0.25 microns. The voltage threshold of the top, or complementary, transistor being formed is then set by implanting into the layer 32, boron ions at an energy of 100 keV with a dose density of $2 \times 10^{11}$/cm$^2$.

Figure 16:
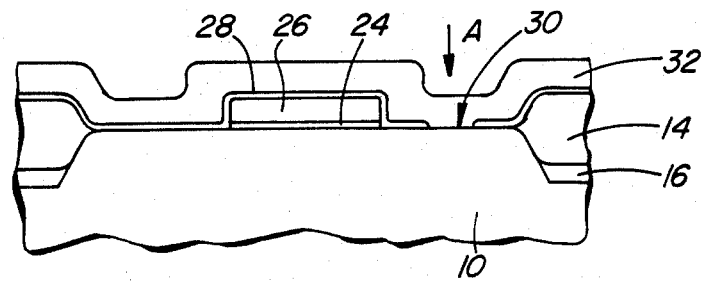
Figure 17:
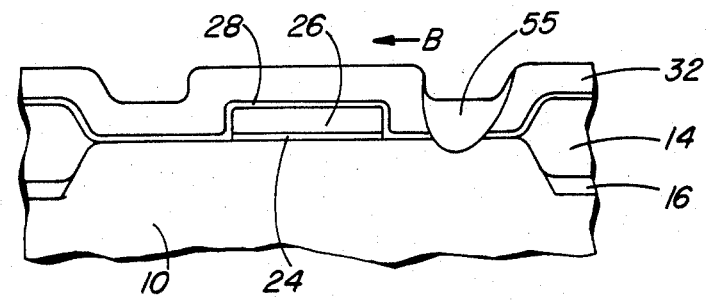
Figure 18:
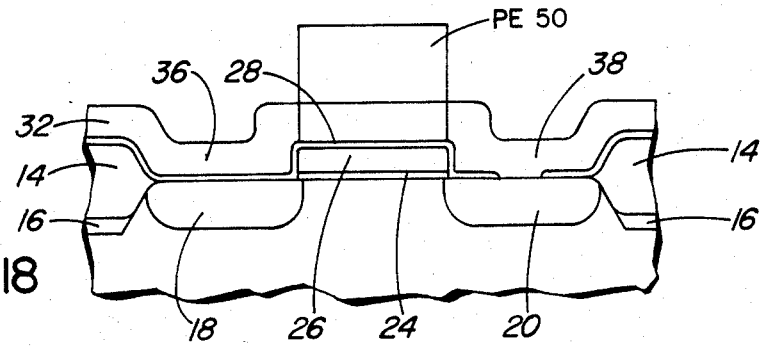
Figure 19:
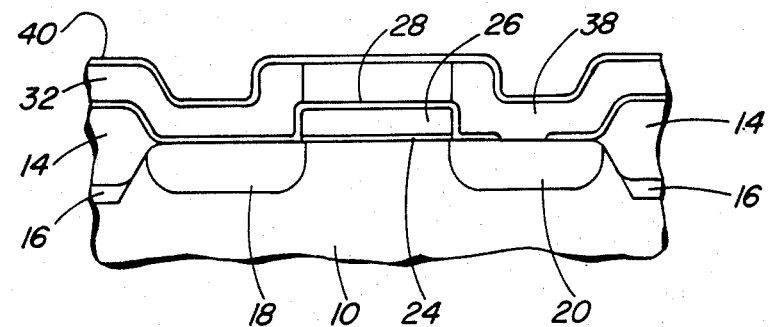

To promote lateral seeding of the upper crystalline layer 32 from the underlying silicon bulk substrate 10 the polysilicon 32 and part at least of the underlying substrate 10 are melted using an 8 watt continuous wave argon laser beam A of diameter 50 microns and scanning rate of 50 cm/second (FIG. 16). When the laser beam is directly over the opening 30, it causes a melt pool 55 to extend down through the polysilicon film 32 and into the single crystal substrate 10 as shown in the sectional view of FIG. 17. As the laser beam is moved away from the seed window 30, in the direction of arrow B, the first region to cool and re-solidify is the single crystal substrate 10. The crystallization front then moves up from the substrate 10 and follows the trailing edge of the melt pool across the surface of the oxide layer 54. The result of this process is a continuous film of single crystal silicon with the same crystallographic orientation as that of the substrate. High quality thin film transistors can be fabricated in this second substrate which, over most of its area, is separated from the original substrate by the gate oxide layer 28.

Essential to such lateral seeding is the seeding window 30 through which the lateral seeding process can start. Because well ordered crystallization can only proceed for a limited lateral distance of about 50 microns from the seed window, the location of the window in relation to the active channel region of the transistor is important. The extent through which lateral crystallization takes place is also influenced by the topography of the structure and thus large steps in the structure beneath the polysilicon are avoided.

The recrystallization of silicon films is dependent also on the difference in temperature encountered by the polysilicon film when it is on top of the relatively thick field oxide as compared to the temperature experienced down in the device well. Because of the thermal insulating properties of the field oxide, the polysilicon over the field oxide can become too hot for the condition required to produce a deep melt within the substrate which is needed for lateral seeding. To overcome this problem, one alternative is to use an anti-reflection coating over the polysilicon film in the device well in a technique known as selective laser annealing (SLA) and described in our co-pending application No. 544,497, filed Oct. 24, 1983, now U.S. Pat. No. 4,561,906. In its application to vertically integrated devices, SLA introduces several additional photoengraving steps with the consequent risk of misalignment problems. Moreover, to achieve good recrystallization of polysilicon films on top of oxide, the center of the region which is to be recrystallized should be cooler than the edges. If a single antireflection coating is used, this cannot be the case. The film must therefore be selectively placed or vary in reflectivity over its area.

The problem of large temperature difference of the polysilicon over the field oxide compared with the laterally adjacent polysilicon can alternatively be solved by using a thin field oxide layer which is so thin, of the order of 0.5 microns that the thermal insulation effect is minimized. It is noted that in standard MOS processing a field oxide layer of a thickness greater than 1 micron is common.

Following lateral seeding of the layer 32, a further photoengraving mask PE 50 is formed (FIG. 2) in order to define source regions 18 and 36 and drain regions 20 and 38 of the eventual device. Three ion implantation steps are performed: firstly phosphorus ions with an energy of 300 keV and a dose of $1 \times 10^{16}$ ions/cm$^2$; secondly boron ions with an energy of 40 keV and a dose of $1 \times 10^{16}$/cm$^2$; and finally boron ions with an energy of 20 keV and a dose of $1 \times 10^{14}$ ions/cm$^2$. The implanted ions are subsequently rendered active by a laser annealing step (FIG. 18) with a beam diameter of 50 microns, an ouput power of 5 watts and a scan rate of 50 cm/second to produce substrate source and drain 18 and 20 and upper source and drain 36 and 38.

Figure 20:
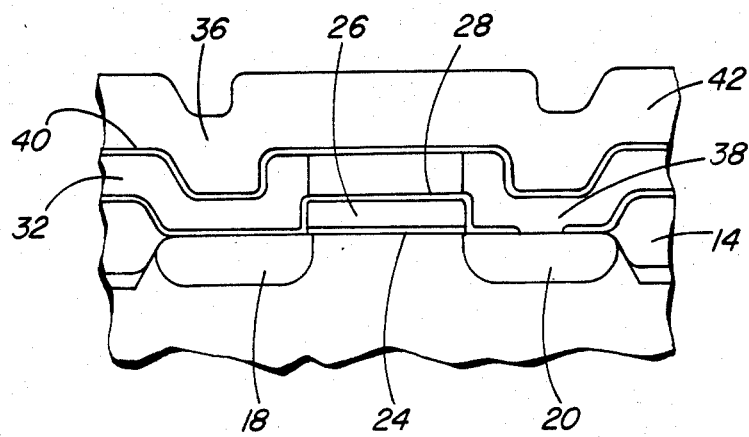

After the source and drain implants, a fifth mask PE 40 (FIG. 2) is produced over the wafer and those areas of the polysilicon layer which are not required for the upper transistor are etched away. A 200Å thick layer 40 of oxide is thermally grown (FIG. 19) and functions to prevent phosphorus diffusion from a subsequently deposited layer 42 of phosphorus silica glass (PSG) (FIG. 20). Using a mask PE 70 (FIG. 2) contact windows are opened through the phosphorus silica glass outside of the device area (FIG. 2).

As shown in FIG. 2, using a further mask PE 80, aluminum is deposited through to the source region 18 and to the polysilicon 32 connected to the source drain regions 36 and 38 from bonding pads which are offset from the device well. Lastly, using a mask PE 90 a Pyrox layer is deposited over the wafer to provide scratch protection.

Using the method of the invention it can be seen that the particular ordering of process steps provides a high degree of lateral seeding from the substrate single crystal silicon 10 while preventing the undesired diffusion of dopants from previously formed source and drain regions.

Compared with two-dimensional or non-stacked CMOS inverters a large saving in area accrues because the complementary transistor need not be built into an area consuming tub. Moreover the speed of the structure is increased because of a reduction in parasitic capacitances which occur where interconnects lie over bulk silicon. A further important aspect of the CMOS structure is that it is latch-up free. This has been a common problem for VLSI CMOS circuits. It is noted that the number of photoengraving steps for the stacked structure shown is eight whereas a typical number of process steps required in the manufacture of non-stacked CMOS inverters requires eleven steps.

Although the description relates specifically to fabrication of a CMOS inverter, the process can be used with some slight modification for the manufacture of stacked NMOS or PMOS circuits or in the manufacture of silicon-on-insulator (SOI) thin film devices. Because the CMOS inverter process is the most complicated of the four technologies, it has been described in great detail.

Figure 21:
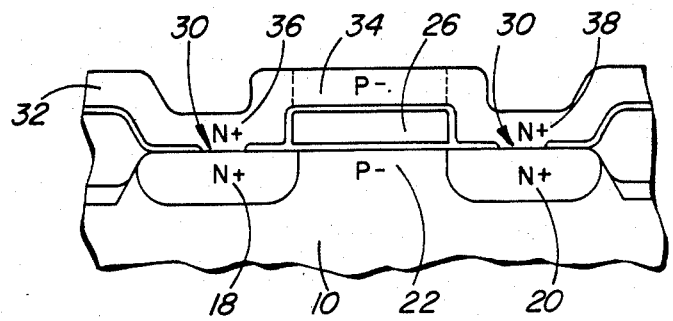
FIG. 21 shows an alternative transistor structure obtainable using the method of the invention.

Referring to FIG. 21 in which features equivalent to those shown in FIG. 1 are designated by like numerals, a stacked MOS n channel transistor is shown. In this NMOS transistor, channel duty is shared between upper and lower channel regions 34 and 22 respectively. It is similar in sectional view to the FIG. 1 inverter one important difference being that the device has two windows 30. In the manufacturing process seeded crystal growth within the laser melted top polysilicon layer 32 is encouraged from both of the contact windows. Following the seeding of a single crystal or near single crystal top substrate, the wafer is subjected to ion implantation to render both the upper and lower source and drain regions n$^+$-type. A second distinction between the FIG. 1 inverter and the FIG. 21 transistor is that the transistor is only a three terminal device and no connection is needed to the lower source. Thus a connection from the gate 26 to a remote contact location (not shown) can use an extension of the gate polysilicon 26 and connections from the source 36 and drain 38 to remote contact locations (not shown) can use sections of the polysilicon layer 32.

Although the previous description relates specifically to the manufacture of vertically integrated or stacked silicon devices, the process can be used to make devices using alternative semiconductors such as group 111-V compounds of which a significant example because of device response speed, is gallium arsenide.

Although the specification discusses MOS (metal-oxide-semiconductor) devices, the gates of the devices described are made not of metal but of a polycrystalline semiconductor which has been rendered conducting. "Metal-oxide-semiconductor" in the specification means a field effect device having separated source and drain, and a channel region defined by a conductor, insulator and semiconductor.

What is claimed is:

1. A process for the fabrication of vertically integrated MOS devices comprising the ordered steps of:
   forming field oxide regions on a semiconductor substrate;
   forming a first gate oxide region on the substrate;
   forming a gate on the first oxide region;
   forming a second gate oxide region over the gate;
   depositing a polycrystalline semiconductor layer over the gate and oxide regions so as to directly contact the substrate of at least one contact position;
   heating, melting and then cooling the polycrystalline on the substrate to promote lateral seeding thereof from the substrate semiconductor at the or each contact position; and
   after lateral seeding of the polycrystalline, forming sources and drains in both the substrate and recrystallized polycrystalline semiconductor by ion implantation using a plurality of separate implants at different energies to achieve desired concentration of ions at a desired depth within the recrystallized and substrate silicon.

2. A process as claimed in claim 1 in which the semiconductor is silicon.

3. A process as claimed in claim 2 further comprising melting the polysilicon and the silicon substrate at a seeding source region near a contact position using a laser.

4. A process as claimed in claim 3 further comprising moving a laser beam away from the seeding source region near a contact position to encourage seeding above the gate.

5. A process as claimed in claim 2 in which the second gate oxide region is etched at a predetermined location to provide a window at which the subsequently deposited polysilicon layer contacts the substrate silicon at said contact position.

6. A process as claimed in claim 5 particularly for forming a CMOS inverter in which the window is vertically aligned with the subsequently formed drains.

7. A process as claimed in claim 2 in which the gate is formed of doped, laser-recrystallized polysilicon.

8. A process as claimed in claim 2 in which each vertically integrated MOS device is formed within a device well bounded by regions of field oxide wherein the field oxide is relatively thin, being of the order of 0.5 microns thick.

9. A process as claimed in claim 1 in which, following implantation of ions to form said sources and drains, the wafer is subjected to a laser annealing step to activate said ions.

10. A process as claimed in claim 2 in which regions of said polysilicon layer are doped and laser annealed to establish conducting paths from sources, drains and gate of said device to bonding pads at remote locations of the substrate.

11. A process as claimed in claim 1 wherein the step of forming sources and drains comprises using a single mask for each of said implants.

12. A prooocess as claimed in claim 11 further including laser annealing after said sources and drains are formed to render the implanted ions active.

* * * * *